United States Patent [19]

McClain et al.

[11] Patent Number: 4,616,177
[45] Date of Patent: Oct. 7, 1986

[54] SAFETY MEASUREMENT DEVICE JUNCTION BOX

[75] Inventors: James E. McClain; William D. Dickson, both of Greenville, Tex.

[73] Assignee: ESCO Manufacturing Company, Greenville, Tex.

[21] Appl. No.: 611,126

[22] Filed: May 17, 1984

[51] Int. Cl.⁴ .............................................. G01R 1/04
[52] U.S. Cl. .................... 324/156; 324/107; 324/127; 361/365; 361/394
[58] Field of Search ............... 324/156, 127, 129, 149, 324/107; 361/365, 368, 372, 393, 394

[56] References Cited

U.S. PATENT DOCUMENTS 1,101,210 6/1914 Potter et al. ..................... 324/149
2,146,555 2/1939 Arey ............................. 324/129 X Primary Examiner—Stanley T. Krawczewicz
Attorney, Agent, or Firm—Kenneth R. Glaser

[57] ABSTRACT

A meter junction box for enabling the safe, accurate and efficient measuring of components of multi-phase electric power includes two separate spaced enclosure housings. The two housings are interconnected by a plurality of electrically conductive, non-magnetic conduits which are environmentally sealed at each end thereof in a manner to secure the interior of each housing from the adverse effects of the environment. A single, insulating jacketed electrical conductor passes through each of the respective conduits from one of the housings to the other. The individual conduits provide a means whereby a hook-on type ammeter may be functionally and individually connected with the conduits to measure the current in the conductor passing therethrough. The non-magnetic characteristics of the conduits enable accurate measurement of the current through the conductors without the adverse effects resulting from a ferrous or magnetic material interfering with the magnetic field generated by electrical current flowing through the conductors.

6 Claims, 3 Drawing Figures

SAFETY MEASUREMENT DEVICE JUNCTION BOX

BACKGROUND OF THE INVENTION

This invention relates to meter boxes for housing meters for measuring the components and characteristics of electric power supplied to a load, and more specifically to a meter box of this type having improved safety features for eliminating the possibility of electrical shock when a hook-on type ammeter is utilized to measure the multi-phase current to the load.

It is well known in the heavy electrical industry to utilize a hook-on ammeter of the type having a hook shaped magnetic core probe which is so constructed to permit the probe to be hooked around a current carrying wire or cable. The magnetic core probe of hook-on ammeters of this type reacts with the magnetic field generated by the current flowing through the wire, the strength of the magnetic field being proportional to the current through the wire. As a result, accurate current measurements may be made without the necessity of breaking the wire and inserting an ammeter therein.

In multi-phase applications, as with heavy industrial electric motors, the different currents in the different phases produce corresponding magnetic fields that always cancel each other, with the result that no magnetic field is generated around a multi-phase power cable. Therefore, prior to the instant invention, it has been impossible to measure multi-phase currents by using hook-on type ammeters.

SUMMARY OF THE INVENTION

The present invention provides an improved meter junction box arrangement for monitoring and measuring the components and characteristics of electric power supplied to a multi-phase load. The junction box is formed of two separate housings, one of the housings containing meters or other devices for measuring phase-to-phase voltages or other characteristics of the multi-phase power. The two boxes are mechanically connected by spaced conduits of non-magnetic, electrically conductive material. The individually insulated electrical conductors pass through these non-magnetic conduits in a manner to permit a hook-on type ammeter to be clamped therearound individually in order to measure the current being drawn by each phase of the load. The non-magnetic conduits are electrically grounded to earth in order to eliminate the possibility of electrical shock due to deterioration of any of the insulating coverings on the electrical conductors. The second housing includes means for separating the individual conductors in a multi-phase power cable in a weather-tight enclosure in order to prevent the elements from adversely affecting the power cable and individual electrical conductors therein.

BRIEF DESCRIPTION OF THE DRAWINGS

Specific features of the invention, as well as additional advantages thereof, will become readily understood by reference to the following detailed description taken in conjunction with the accompanying drawings, in which like reference numerals refer to corresponding parts, and in which.

DETAILED DESCRIPTION OF THE INVENTION

Figure 1:
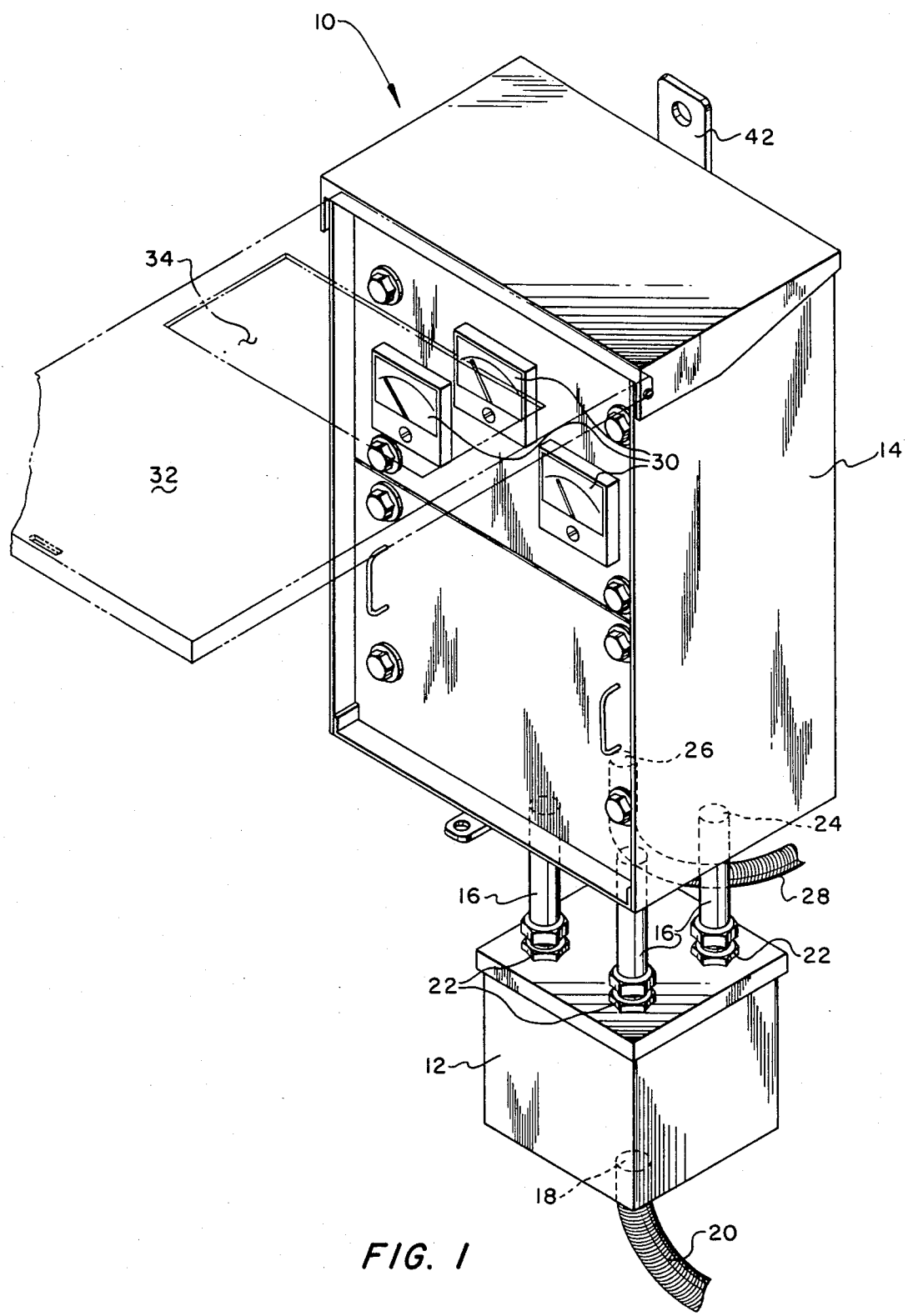
FIG. 1 is a pictorial view of the meter junction box of the present invention.

Turning now to the drawings, and initially to FIG. 1, the meter junction box of the present invention is shown generally illustrated by the numeral 10. The junction box comprises a first (lower) housing 12 and a second (upper) housing 14. The first and second housings are connected by a plurality of electrically conductive, hollow, non-magnetic conduits 16. These conduits 16 are generally rigid, and in the preferred embodiment, are formed of a stainless steel material for purposes that will be explained in greater detail hereinbelow.

The first (or lower) housing 12 includes an inlet port 18 adapted to receive a power cable 20 which supplies multi-phase electric power from a power source (not shown). The first housing 12 also includes a plurality of outlet ports 22 equal to the number of non-magnetic conduits 16, each conduit being connected with a respective outlet port 22 in a manner which environmentally seals off the interior of the lower housing and the interior of the conduit from the elements. In the case of three-phase power, there will be three such conduits 16.

In a similar manner, the second (or upper) housing 14 includes a plurality of inlet ports 24, each corresponding to, and so connected with the upper end of the respective non-magnetic conduits 16 that communication between the respective interiors of the lower and upper housings (by way of conduits 16) are sealed from the environment. The upper housing 14 also includes, at a lower portion thereof, an outlet 26 through which a power output cable 28 passes, the cable 28 being electrically connected with an electric motor (not shown) or other multi-phase load device.

In a preferred embodiment, disposed within the upper housing 14 are a plurality of voltmeters 30 for respectively measuring the phase-to-phase voltages. These voltmeters 30 are environmentally sealed from the elements in a manner to prevent contamination thereof when the meter junction box is used in an industrial or otherwise hazardous environment. As best shown in FIG. 1, the upper housing includes a front door 32 hinged thereto, the door having a window 34 therein permitting visual observation of the voltmeters 30 without the necessity of opening the door.

Figure 2:
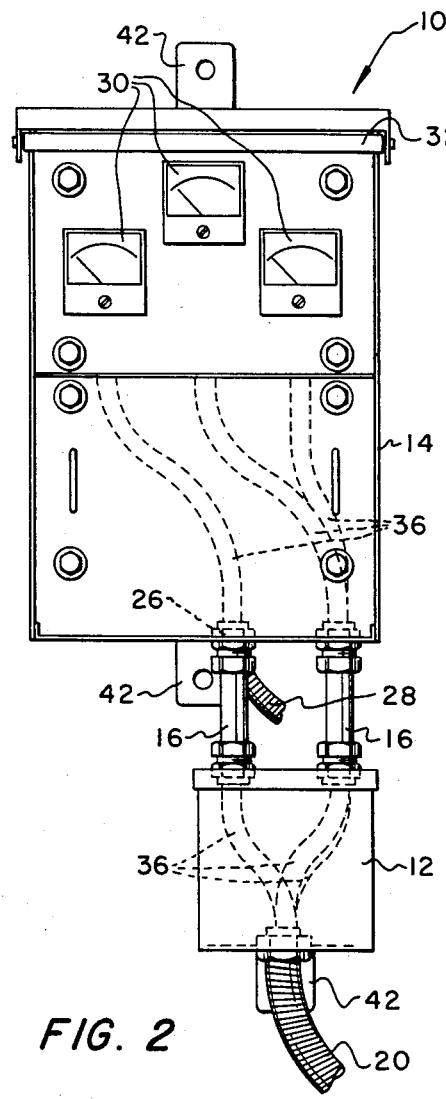
FIG. 2 is a front view of the meter junction box of the present invention.

As best shown in FIG. 2, the individual conductors 36 (in the case of three-phase power, three such conductors) of the input power cable 20 are separated within the confines of the lower housing 12, the housing providing an environmentally sealed shield for the individual conductors and the cable 20. The three electrical conductors 36 are then individually routed through respective non-magnetic conduits 16 to enter the interior of the upper housing 14 through the inlet ports 24 (FIG. 1).

Figure 3:
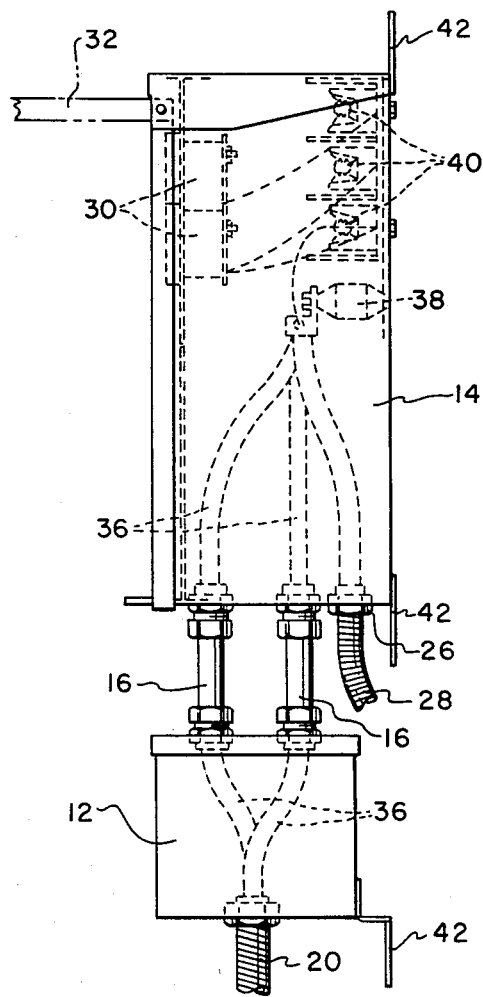
FIG. 3 is a right side view of the meter junction box of the present invention.

Referring to FIG. 3, the individual electrical conductors 36 within the upper housing 14 are initially connected to standoff insulators 38 disposed therein in a manner which electrically isolates the individual conductors from the wall of the housing which is electrically grounded. Individual electrical connections are then made (by way of respective fuses 40) between the conductive taps at standoffs 38 and the voltmeters 30 in a manner known to those skilled in the art to enable the measurement of the phase-to-phase voltages. Because the currents to the voltmeters are extremely low, as compared to the line currents within the conductors 36, the various electrical connectors leading from the standoff insulators 38 to the voltmeters 30 need only be large enough to accommodate the voltmeter currents.

From the standoff insulators 38, the various conductors 36 converge as power output cable 28, which passes through the upper housing outlet port 26, the port 26 being constructed in a manner to environmentally seal off the interior of housing 14. Thus, the interior of the upper housing, like the lower housing, is effectively sealed against the adverse effects of the environment, thereby enabling the meter junction box of the present invention to be safely used in outdoor and/or heavy industrial applications.

The lower and upper housings 12, 14 each include mounting tabs 42 (FIG. 3) located on the back sides thereof to enable mounting the overall device in a conventional manner to a support structure, such as a utility pole or panel (not shown). By mounting the device in this manner, unnecessary stress on the conduits 16 is eliminated, thereby permitting smaller diameter conduits and conduit connections to be used and extending the effective life of the environmental seals in the connections between the conduits and housings.

As noted hereinabove, the individual conduits 16 provide passageways through which the individual conductors 26 can pass from the lower housing to the upper housing with both housings and the conduits being environmentally sealed. Additionally, the conduits 16 provide structural support for the lower and upper housings and inhibit flexure of the individual conductors 36 passing therethrough. As shown, the conduits 16 are spaced apart in a manner to permit a hook-on type ammeter to be readily and easily attached to each conduit in order to measure the respective currents through the conductors 36 during operation of the multi-phase load.

In accordance with a preferred embodiment of the invention, the electrically conductive, non-magnetic conduits 16 are formed of a stainless steel material, resulting in the following significant advantages:

(1) The conduits themselves will impart a structural rigidity between the lower and upper housings;

(2) The conduits protect the individual electrical conductors passing therethrough from physical injury;

(3) The conduits retain the individual conductors stationary relative to the meter box, thus eliminating any chafing of the conductor insulating covering which would otherwise occur due to vibration or movement of the insulated conductor against sharp or rough edges of the meter box housings;

(4) The conduits can be, and are, grounded to each housing, and grounded to earth, in order to protect the user from electrical shock in the event the insulated covering around one or more of the conductors therein becomes deteriorated for whatever reason, and exposes the bare conductor to the conduit;

(5) The non-magnetic nature of the stainless steel conduit material permits accurate ammeter readings, which would otherwise be distorted by the presence of a ferrous material within the magnetic field generated by the current through the individual conductor;

(6) The presence of a ferrous material within the magnetic field generated by the current through an individual conductor interferes with the generated magnetic field, thereby inducing heating and thermal losses; by using a non-ferrous, non-magnetic conduit, magnetic field interference is eliminated; and (7) The stainless steel material prevents deleterious corrosion build up.

Those skilled in the art will readily appreciate that the overall arrangement of the meter junction box of the present invention is particularly advantageous for use in chemically hazardous or otherwise adverse environments in order to provide for the safe, accurate and efficient measurement of components and characteristics of multi-phase electric power supplied to a load. Although a preferred embodiment of the present invention has been disclosed in detail herein, it will be understood that various substitutions and modifications may be made to the preferred embodiment without departing from the scope and spirit of the present invention as recited in the appended claims.

What is claimed is:

1. A measurement device junction box for use in the measurement of components of three-phase electric power supplied from a power source to a load, said box comprising:

a first housing having an inlet therein for receiving a first power cable from said power source;

a second housing spaced from said first housing, said second housing having an outlet therein for receiving a second power cable connected to said load;

a plurality of voltmeters for measuring phase-to-phase voltages, said voltmeters being disposed within said second housing;

a plurality of electrically conductive, non-magnetic spaced apart conduits interconnecting said first housing and said second housing; and electrical conductors electrically connected with said first and second cables passing respectively through said spaced conduits.

2. The junction box as set forth in claim 1, wherein said electrically conductive, non-magnetic spaced conduits are electrically grounded.

3. The junction box as set forth in claim 2, wherein said electrically conductive, non-magnetic conduits are formed of stainless steel.

4. The junction box as set forth in claim 1, whein the respective interiors of said first and second housings are sealed from the environment.

5. The junction box as set forth in claim 4, wherein said second housing further includes a window therein for permitting visual observation of said plurality of voltmeter.

6. A measurement device junction box for use in the measurement of componenets of multi-phase electric power supplied from a power source to a load, said box comprising:

a first housing having an inlet therein for receiving a first power cable from said power source;

a second housing spaced from said first housing, said second housing having an outlet therein for receiving a second power cable connected to said load;

a plurality of voltmeters for measuring phase-to-phase voltages, said voltmeters being disposed within said second housing;

a plurality of electrically conductive, non-magnetic spaced apart conduits interconnecting said first housing and said second housing; and electrical conductors electrically connected with said first and second cables passing respectively through said spaced conduits.

* * * * *